(12) United States Patent
Chang et al.

(10) Patent No.: US 10,510,406 B1
(45) Date of Patent: Dec. 17, 2019

(54) SOFT-VERIFY WRITE ASSIST CIRCUIT OF RESISTIVE MEMORY AND OPERATING METHOD THEREOF

(71) Applicant: NATIONAL TSING HUA UNIVERSITY, Hsinchu (TW)

(72) Inventors: Meng-Fan Chang, Taichung (TW); Huan-Ting Lin, Taoyuan (TW); Tsung-Yuan Huang, New Taipei (TW); Wei-Hao Chen, Yunlin County (TW); Han-Wen Hu, Tainan (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/168,815

(22) Filed: Oct. 23, 2018

(51) Int. Cl.
*G11C 13/00* (2006.01)
*G11C 16/10* (2006.01)

(52) U.S. Cl.
CPC .......... *G11C 13/00* (2013.01); *G11C 13/0064* (2013.01); *G11C 13/0069* (2013.01); *G11C 16/10* (2013.01)

(58) Field of Classification Search
CPC . G11C 16/10; G11C 13/0064; G11C 13/0069; G11C 1311/34
See application file for complete search history.

(56) References Cited

U.S. PATENT DOCUMENTS

| | | | |
|---|---|---|---|
| 6,967,873 B2* | 11/2005 | Hamilton | G11C 16/0475 365/185.29 |
| 2014/0204678 A1* | 7/2014 | Mu | G11C 16/10 365/185.19 |
| 2015/0269997 A1* | 9/2015 | Lin | G11C 11/1655 365/148 |

* cited by examiner

*Primary Examiner* — Ajay Ojha
(74) *Attorney, Agent, or Firm* — CKC & Partners Co., LLC

(57) ABSTRACT

An operating method of the soft-verify write assist circuit of the resistive memory provides a voltage level applying step, a write operating step and a write voltage controlling step. The voltage level applying step is for applying a plurality of voltage levels to the reference voltage, the word line and the switching signal, respectively. The write operating step is for driving the memory cell to perform in a set process or a reset process via the first three-terminal switching element, the second three-terminal switching element and the soft-verify controlling unit during a write operation. The write voltage controlling step is for controlling the write voltage to be increased in the ramping cycle and decreased in the soft-verify cycle.

20 Claims, 8 Drawing Sheets

SOFT-VERIFY WRITE ASSIST CIRCUIT OF RESISTIVE MEMORY AND OPERATING METHOD THEREOF

BACKGROUND

Technical Field

The present disclosure relates to a write assist circuit of a resistive memory and an operating method thereof. More particularly, the present disclosure relates to a soft-verify write assist circuit of a resistive memory and an operating method thereof.

Description of Related Art

Resistive random access memory (ReRAM) is an attractive candidate for next generation embedded nonvolatile memory, with several advantages compared to conventional flash technology. First, ReRAM is a CMOS-compatible low temperature back-end of line (BEOL) memory. There is almost no mutual impact between ReRAM element and front-end CMOS devices during a wafer processing. Second, it only needs 2-4 extra masks, resulting in lower chip cost compared to an embedded flash. Third, its byte-alterability makes it capable of being used as a unified memory for storage of instruction code and real-time data.

From experimental results of a conventional write assist circuit of ReRAM, it was found that a long write pulse for a set process or a reset process is more effective than multiple short pulses. However, due to variability of ReRAM bit cells, a long write pulse may cause over-write, which either impacts the speed of subsequent write operations or damages the ReRAM element. Moreover, the conventional write assist circuit of ReRAM requires a read cycle to perform a verify operation with a sense amplifier and has a large voltage swing at a bit line and a source line of the memory cell under the write operation. Therefore, a soft-verify write assist circuit of a resistive memory and an operating method thereof having the features of performing the verify operation without any read cycle, having a lower voltage swing at the bit line and the source line and no need to change a polarity of the bit line and the source line under the write operation are commercially desirable.

SUMMARY

According to one aspect of the present disclosure, a soft-verify write assist circuit of a resistive memory is controlled by a reference voltage, a word line and a switching signal. The soft-verify write assist circuit of the resistive memory includes a memory cell, a first three-terminal switching element, a second three-terminal switching element and a soft-verify controlling unit. The memory cell is controlled by the word line and includes a bit line and a source line. The first three-terminal switching element is electrically connected between the memory cell and a ground voltage. The first three-terminal switching element is controlled by the switching signal. The second three-terminal switching element is electrically connected to the memory cell. The second three-terminal switching element is controlled by the switching signal. The soft-verify controlling unit is electrically connected to the second three-terminal switching element. The soft-verify controlling unit includes a write data line, a comparator and a soft-verify write voltage controlling module. The write data line is signally connected to the second three-terminal switching element. The comparator is signally connected to the write data line and the reference voltage. The comparator is configured to compare a voltage level of the write data line with the reference voltage to generate a write voltage controlling signal. The soft-verify write voltage controlling module is signally connected to the comparator. The soft-verify write voltage controlling module generates a write voltage according to the write voltage controlling signal. The write voltage is applied on the write data line. The write voltage is increased in a ramping cycle and decreased in a soft-verify cycle, and the soft-verify cycle is next to the ramping cycle. The first three-terminal switching element is switched by the switching signal to enable the ground voltage to be coupled to the source line or the bit line, and the second three-terminal switching element is switched by the switching signal to enable the write data line to be coupled to the bit line or the source line.

According to another aspect of the present disclosure, an operating method of the soft-verify write assist circuit of the resistive memory provides a voltage level applying step, a write operating step and a write voltage controlling step. The voltage level applying step is for applying a plurality of voltage levels to the reference voltage, the word line and the switching signal, respectively. The write operating step is for driving the memory cell to perform in a set process or a reset process via the first three-terminal switching element, the second three-terminal switching element and the soft-verify controlling unit during a write operation. The write voltage controlling step is for controlling the write voltage to be increased in the ramping cycle and decreased in the soft-verify cycle.

BRIEF DESCRIPTION OF THE DRAWINGS

The present disclosure can be more fully understood by reading the following detailed description of the embodiment, with reference made to the accompanying drawings as follows.

DETAILED DESCRIPTION

Before describing any embodiments in detail, some terms used in the following are described. A voltage level of "1" represents that the voltage is equal to a power supply voltage VDD. The voltage level of "0" represents that the voltage is equal to a ground voltage VSS. A PMOS transistor and an NMOS transistor represent a P-type MOS transistor and an N-type MOS transistor, respectively. Each transistor has a source, a drain and a gate.

Figure 1:
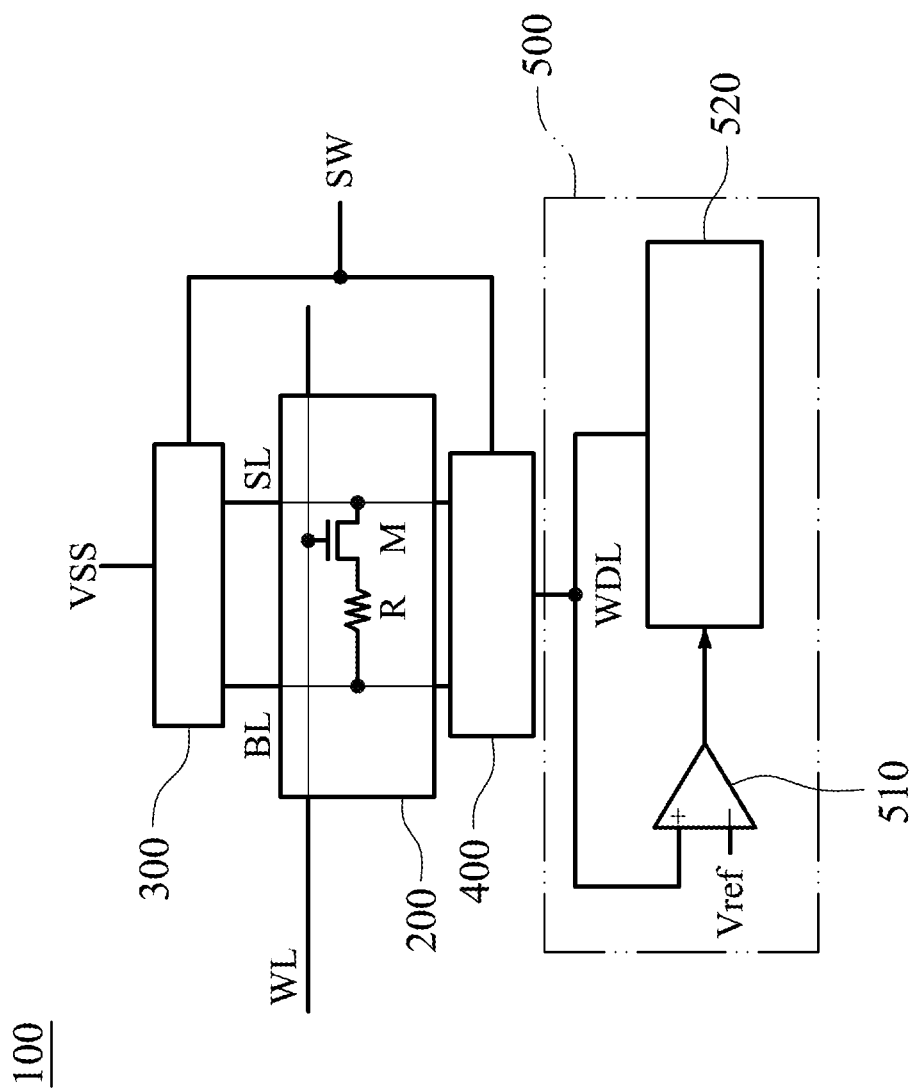
FIG. 1 shows a block diagram of a soft-verify write assist circuit of a resistive memory according to one embodiment of the present disclosure.
Figure 2:
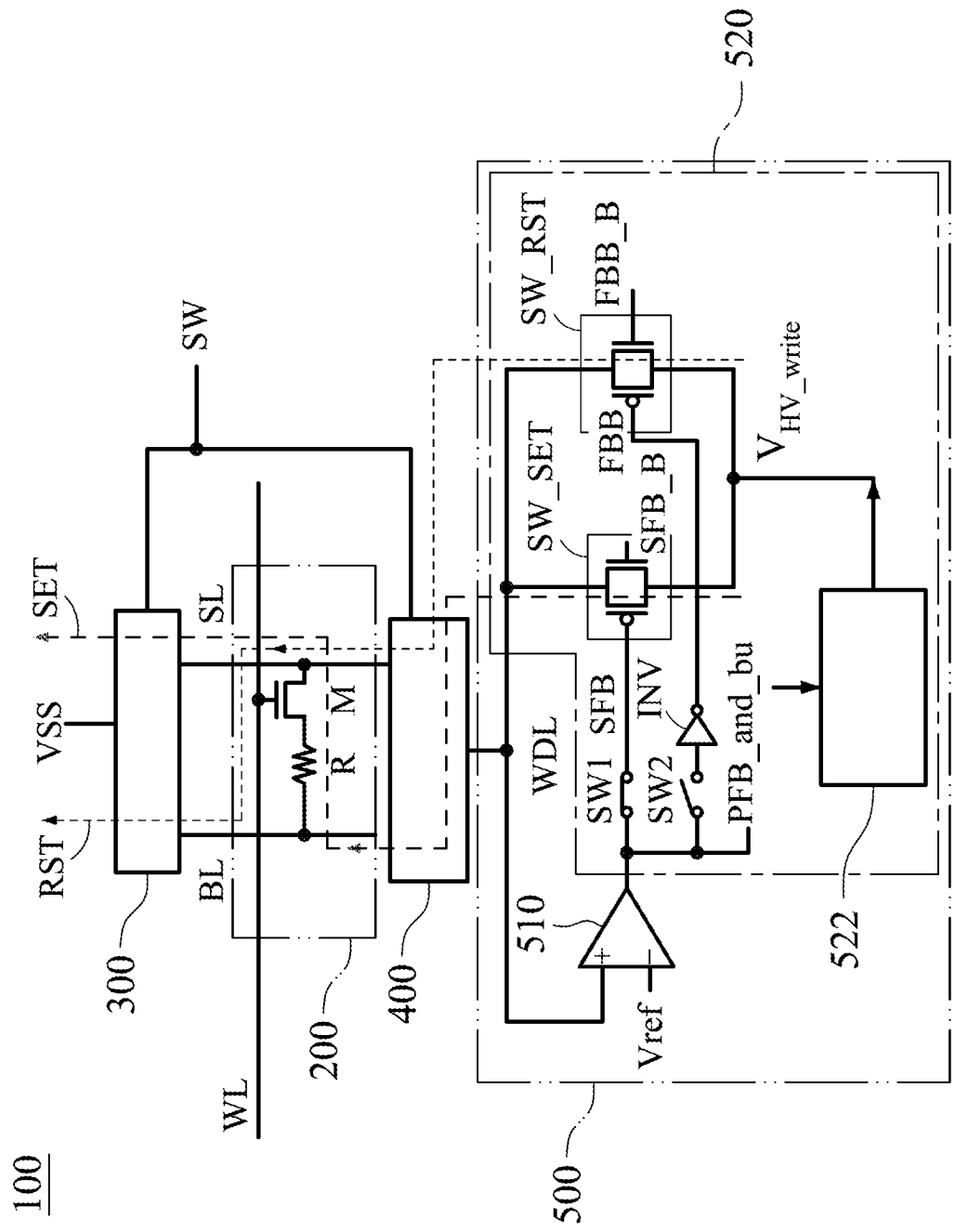
FIG. 2 shows a block diagram of a soft-verify write assist circuit of a resistive memory according to another embodiment of the present disclosure.

FIG. 1 shows a block diagram of a soft-verify write assist circuit 100 of a resistive memory according to one embodiment of the present disclosure. FIG. 2 shows a block diagram of a soft-verify write assist circuit 100 of a resistive memory according to another embodiment of the present disclosure. The soft-verify write assist circuit 100 of the resistive memory is controlled by a reference voltage Vref, a word line WL and a switching signal SW. The soft-verify write assist circuit 100 of the resistive memory includes a memory cell 200, a first three-terminal switching element 300, a second three-terminal switching element 400 and a soft-verify controlling unit 500.

The memory cell 200 is controlled by the word line WL and includes a bit line BL and a source line SL. In the resistive memory, the memory cell 200 can be represented by a resistance R and an NMOS transistor M. The resistance R is connected between the bit line BL and the source of the NMOS transistor M. The gate of the NMOS transistor M is connected to the word line WL. The drain of the NMOS transistor M is connected to the source line SL.

The first three-terminal switching element 300 is electrically connected between the memory cell 200 and the ground voltage VSS. The first three-terminal switching element 300 is controlled by the switching signal SW. In detail, the first three-terminal switching element 300 is switched to connect the ground voltage VSS to the bit line BL or the source line SL according to the switching signal SW. In other words, the first three-terminal switching element 300 is switched by the switching signal SW to enable the ground voltage VSS to be coupled to the source line SL or the bit line BL. The first three-terminal switching element 300 can be implemented by two NMOS transistors and two PMOS transistors. Two gates of the two NMOS transistors of the first three-terminal switching element 300 are coupled to the switching signal SW and an inverse switching signal, respectively. The voltage level of the switching signal SW is opposite to the voltage level of the inverse switching signal. Two gates of the two PMOS transistors of the first three-terminal switching element 300 are coupled to the switching signal SW and the inverse switching signal, respectively.

The second three-terminal switching element 400 is electrically connected to the memory cell 200. The second three-terminal switching element 400 is controlled by the switching signal SW. The structure of the second three-terminal switching element 400 is the same as the structure of the first three-terminal switching element 300. The second three-terminal switching element 400 is switched by the switching signal SW to enable the write data line WDL to be coupled to the bit line BL or the source line SL.

The soft-verify controlling unit 500 is electrically connected to the second three-terminal switching element 400. The soft-verify controlling unit 500 includes a write data line WDL, a comparator 510 and a soft-verify write voltage controlling module 520. The write data line WDL is signally connected to the second three-terminal switching element 400. The comparator 510 is signally connected to the write data line WDL and the reference voltage Vref. The comparator 510 is configured to compare a voltage level of the write data line WDL with the reference voltage Vref to generate a write voltage controlling signal PFB_and_bu. The soft-verify write voltage controlling module 520 is signally connected to the comparator 510. The soft-verify write voltage controlling module 520 generates a write voltage $V_{HV-write}$ according to the write voltage controlling signal PFB_and_bu. The write voltage $V_{HV-write}$ is applied on the write data line WDL. The write voltage $V_{HV-write}$ is increased in a ramping cycle and decreased in a soft-verify cycle, and the soft-verify cycle is next to the ramping cycle. Therefore, the soft-verify write assist circuit 100 of the resistive memory of the present disclosure does not require any read cycle with an operation of a sense amplifier so as to reduce power consumption. In addition, the soft-verify write assist circuit 100 of the resistive memory of the present disclosure has a lower voltage swing at the bit line BL and the source line SL and does not require to change a polarity of the bit line BL and the source line SL under the write operation.

Figure 4:
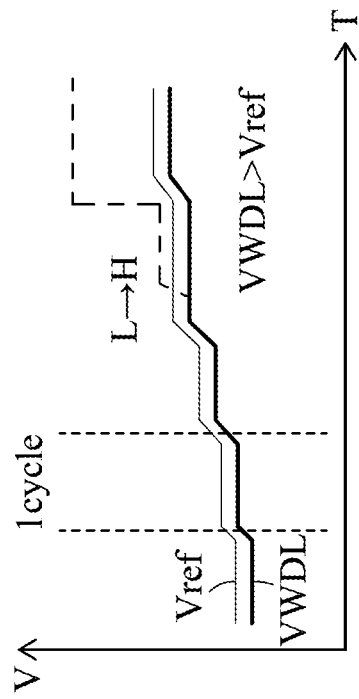
FIG. 4 shows timing diagrams of the reference voltage and a voltage level of the write data line in a reset process during the write operation.
Figure 3:
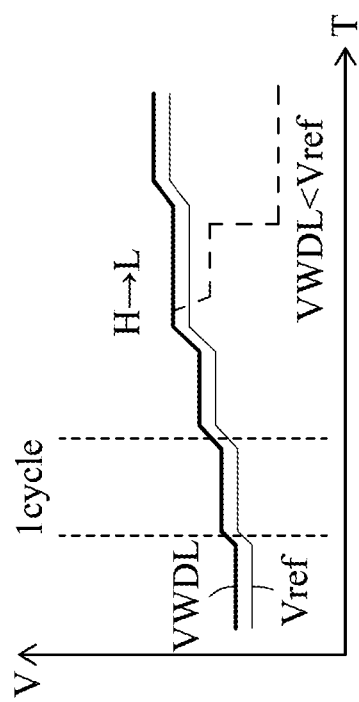
FIG. 3 shows timing diagrams of the reference voltage and a voltage level of the write data line in a set process during a write operation.

FIG. 3 shows timing diagrams of the reference voltage Vref and a voltage level VWDL of the write data line WDL in a set process during a write operation. FIG. 4 shows timing diagrams of the reference voltage and a voltage level of the write data line in a reset process during the write operation. In FIGS. 2-4, the memory cell 200 may be performed in the set process or the reset process during the write operation. The set process represents that the resistance R is changed from a high resistance state (HRS) to a low resistance state (LRS). A set path SET is formed in the set process, and a reset path RST is formed in the reset process. The reset process represents that the resistance R is changed from the low resistance state to the high resistance state. In the set process, the first three-terminal switching element 300 is switched by the switching signal SW to enable the ground voltage VSS to be coupled to the source line SL, and the second three-terminal switching element 400 is switched by the switching signal SW to enable the write data line WDL to be coupled to the bit line BL. In the reset process, the first three-terminal switching element 300 is switched by the switching signal SW to enable the ground voltage VSS to be coupled to the bit line BL, and the second three-terminal switching element 400 is switched by the switching signal SW to enable the write data line WDL to be coupled to the source line SL.

In FIGS. 2-4, if the voltage level VWDL of the write data line WDL is greater than the reference voltage Vref, the write voltage controlling signal PFB_and_bu generated by the comparator 510 is equal to the ground voltage VSS. On the contrary, if the voltage level VWDL of the write data line WDL is smaller than the reference voltage Vref, the write voltage controlling signal PFB_and_bu generated by the comparator is equal to the power supply voltage VDD. Moreover, the soft-verify write voltage controlling module 520 includes a first two-terminal switching element SW1, a set-path two-terminal switching element SW SET, a second two-terminal switching element SW2, an inverter INV, a reset-path two-terminal switching element SW RST and a soft-verify control block 522.

The first two-terminal switching element SW1 is electrically connected to the write voltage controlling signal PFB_and_bu. The first two-terminal switching element SW1 is controlled by a first switching control signal SW1(SET).

The set-path two-terminal switching element SW SET is electrically connected between the write voltage $V_{HV\_write}$ and the write data line WDL. The set-path two-terminal switching element SW SET is coupled to the first two-terminal switching element SW1. The first two-terminal switching element SW1 is coupled between the write voltage controlling signal PFB_and_bu and a first set-feedback line SFB. The set-path two-terminal switching element SW SET can be implemented by one NMOS transistor and one PMOS transistor. A gate of the PMOS transistor of the set-path two-terminal switching element SW SET is coupled to the first set-feedback line SFB. A gate of the NMOS transistor of the set-path two-terminal switching element SW SET is coupled to a second set-feedback line SFB_B. The voltage level of the second set-feedback line SFB_B is opposite to the voltage level of the first set-feedback line SFB. When the first two-terminal switching element SW1 becomes a short circuit, the set-path two-terminal switching element SW SET is controlled by the write voltage controlling signal PFB_and_bu. When the first two-terminal switching element SW1 becomes an open circuit, the set-path two-terminal switching element SW SET becomes the short circuit.

The second two-terminal switching element SW2 is electrically connected to the write voltage controlling signal PFB_and_bu. The second two-terminal switching element SW2 is controlled by a second switching control signal SW2(RST). The inverter INV is electrically connected to the second two-terminal switching element SW2. The reset-path two-terminal switching element SW RST is electrically connected between the write voltage $V_{HV\_write}$ and the write data line WDL. The reset-path two-terminal switching element SW RST is coupled to the inverter INV. The inverter INV is coupled between the second two-terminal switching element SW2 and a first reset-feedback line FBB. The reset-path two-terminal switching element SW RST can be implemented by one NMOS transistor and one PMOS transistor. A gate of the PMOS transistor of the reset-path two-terminal switching element SW RST is coupled to the first reset-feedback line FBB. A gate of the NMOS transistor of the reset-path two-terminal switching element SW RST is coupled to a second reset-feedback line FBB_B. The voltage level of the second reset-feedback line FBB_B is opposite to the voltage level of the first reset-feedback line FBB. When the second two-terminal switching element SW2 becomes a short circuit, the reset-path two-terminal switching element SW RST is controlled by the write voltage controlling signal PFB_and_bu. When the second two-terminal switching element SW2 becomes an open circuit, the reset-path two-terminal switching element SW RST becomes the short circuit.

The soft-verify control block 522 is electrically connected between the write voltage controlling signal PFB_and_bu and the write voltage $V_{HV\_write}$. The soft-verify control block 522 generates a ramping write termination flag RW_flag in the ramping cycle and a soft-verify flag SV_flag in the soft-verify cycle according to the write voltage controlling signal PFB_and_bu to change the write voltage $V_{HV\_write}$. In the set process, if the write voltage controlling signal PFB_and_bu is equal to the power supply voltage VDD in the ramping cycle, the ramping write termination flag RW_flag is set to the power supply voltage VDD. If the write voltage controlling signal PFB_and_bu is equal to the power supply voltage VDD in the soft-verify cycle, the soft-verify flag SV_flag is set to the power supply voltage VDD. In the reset process, if the write voltage controlling signal PFB_and_bu is equal to the ground voltage VSS in the ramping cycle, the ramping write termination flag RW_flag is set to the power supply voltage VDD. If the write voltage controlling signal PFB_and_bu is equal to the ground voltage VSS in the ramping cycle, the soft-verify flag SV_flag is set to the power supply voltage VDD. Accordingly, the soft-verify write assist circuit 100 of the resistive memory of the present disclosure utilizes the ramping write termination flag RW_flag and the soft-verify flag SV_flag to check what exactly resistance of the memory cell 200 is, and does not require any read cycle to perform a verify operation with a sense amplifier so as to reduce power consumption. In addition, the soft-verify write assist circuit 100 of the resistive memory of the present disclosure has a lower voltage swing at the bit line BL and the source line SL and does not require to change a polarity of the bit line BL and the source line SL under the write operation.

Figures 5, 6:
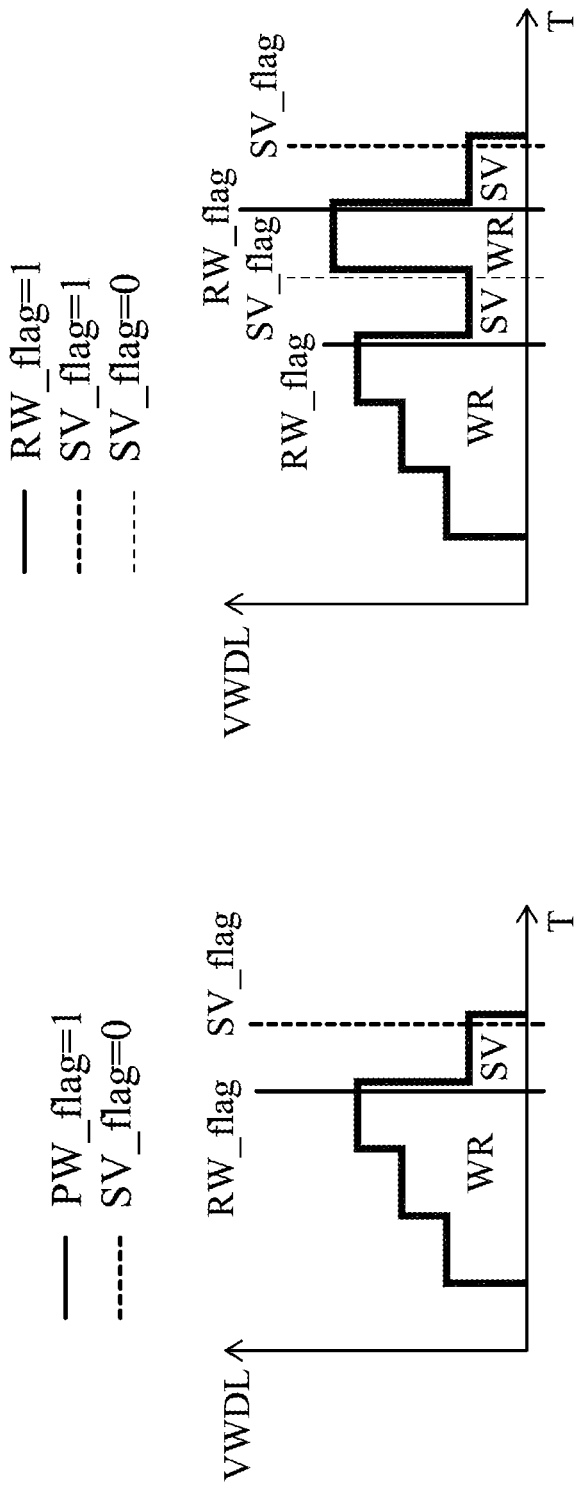
FIG. 5 shows a timing diagram of the voltage level of the write data line of FIG. 2 when the memory cell is a fast cell.
FIG. 6 shows a timing diagram of the voltage level of the write data line of FIG. 2 when the memory cell is a first abnormal cell.

FIG. 5 shows a timing diagram of the voltage level VWDL of the write data line WDL of FIG. 2 when the memory cell 200 is a fast cell. In FIGS. 2 and 5, a ramping write termination flag RW_flag and a soft-verify flag SV_flag are generated by the soft-verify controlling unit 500 in a third cycle and a fourth cycle, respectively. "WR" represents the ramping cycle, and "SV" represents the soft-verify cycle. The ramping write termination flag RW_flag and the soft-verify flag SV_flag are both equal to 1. Then, the soft-verify write assist circuit 100 of the resistive memory turns off the write operation and a write path (e.g., the set path SET or the reset path RST) when the soft-verify flag SV_flag is equal to 1 in the fourth cycle.

FIG. 6 shows a timing diagram of the voltage level VWDL of the write data line WDL of FIG. 2 when the memory cell is a first abnormal cell. In FIGS. 2 and 6, a first ramping write termination flag RW_flag and a first soft-verify flag SV_flag are generated by the soft-verify controlling unit 500 in a third cycle and a fourth cycle, respectively. A second ramping write termination flag RW_flag and a second soft-verify flag SV_flag are generated by the soft-verify controlling unit 500 in a fifth cycle and a sixth cycle, respectively. The first ramping write termination flag RW_flag, the second ramping write termination flag RW_flag and the second soft-verify flag SV_flag are equal to 1. The first soft-verify flag SV_flag is equal to 0. Then, the soft-verify write assist circuit 100 of the resistive memory turns off the write operation and the write path when the second soft-verify flag SV_flag is equal to 1 in the sixth cycle.

Figures 7, 8:
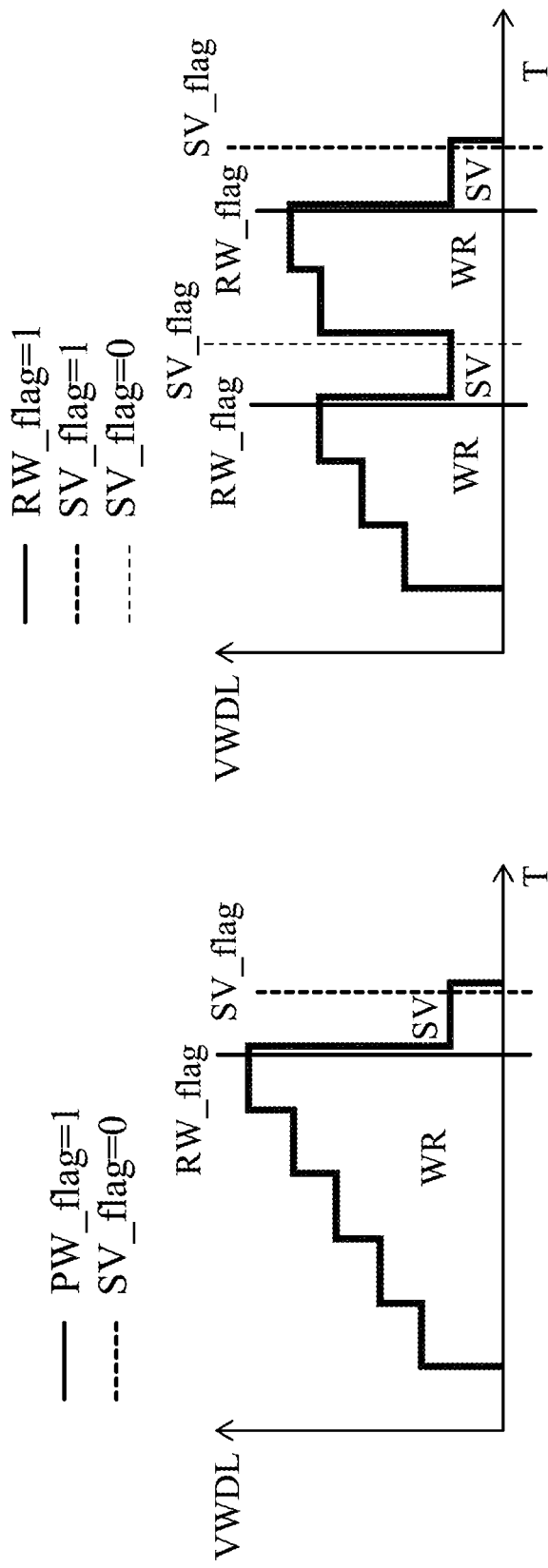
FIG. 7 shows a timing diagram of the voltage level of the write data line of FIG. 2 when the memory cell is a slow cell.
FIG. 8 shows a timing diagram of the voltage level of the write data line of FIG. 2 when the memory cell is a second abnormal cell.

FIG. 7 shows a timing diagram of the voltage level VWDL of the write data line WDL of FIG. 2 when the memory cell 200 is a slow cell. In FIGS. 2 and 7, a ramping write termination flag RW_flag and a soft-verify flag SV_flag are generated by the soft-verify controlling unit 500 in a fifth cycle and a sixth cycle, respectively. The ramping write termination flag RW_flag and the soft-verify flag SV_flag are both equal to 1. Then, the soft-verify write assist circuit 100 of the resistive memory turns off the write operation and the write path (e.g., the set path SET or the reset path RST) when the soft-verify flag SV_flag is equal to 1 in the sixth cycle.

FIG. 8 shows a timing diagram of the voltage level VWDL of the write data line WDL of FIG. 2 when the memory cell is a second abnormal cell. In FIGS. 2 and 8, a first ramping write termination flag RW_flag and a first soft-verify flag SV_flag are generated by the soft-verify controlling unit 500 in a third cycle and a fourth cycle, respectively. A second ramping write termination flag RW_flag and a second soft-verify flag SV_flag are generated by the soft-verify controlling unit 500 in a sixth cycle and a seventh cycle, respectively. The first ramping write termination flag RW_flag, the second ramping write termination flag RW_flag and the second soft-verify flag SV_flag are equal to 1. The first soft-verify flag SV_flag is equal to 0. Then, the soft-verify write assist circuit 100 of the resistive memory turns off the write operation and the write path when the second soft-verify flag SV_flag is equal to 1 in the seventh cycle.

Figure 9:
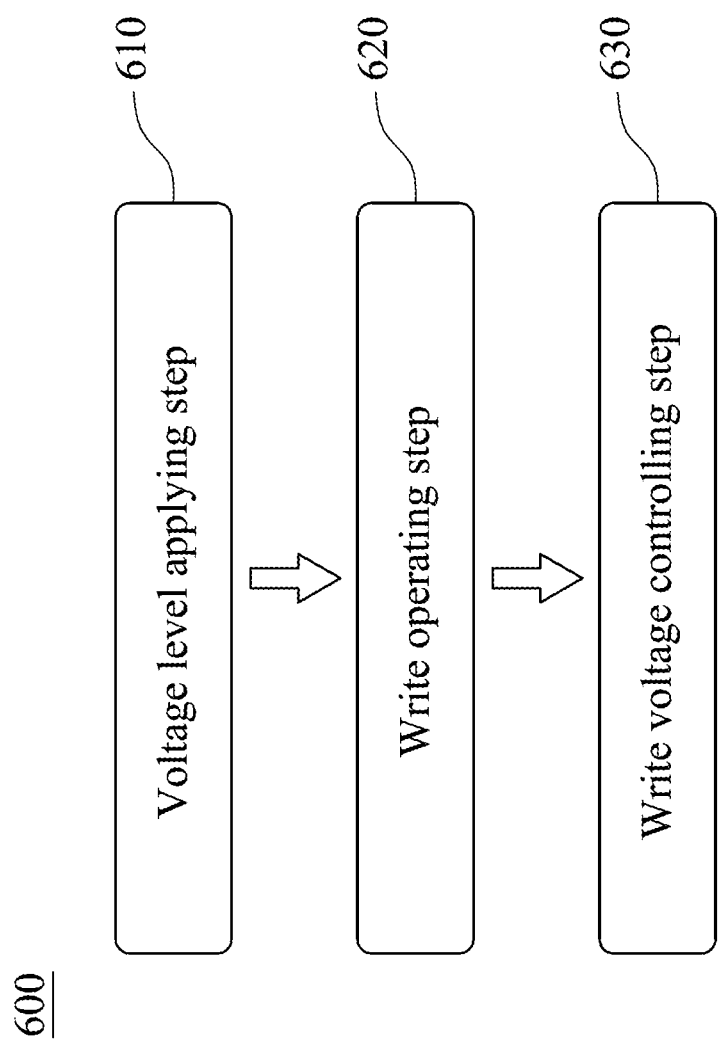
FIG. 9 shows a flow chart of an operating method of the soft-verify write assist circuit of the resistive memory according to one embodiment of the present disclosure.

FIG. 9 shows a flow chart of an operating method 600 of the soft-verify write assist circuit 100 of the resistive memory according to one embodiment of the present disclosure. The operating method 600 may be applied to the soft-verify write assist circuit 100 of the resistive memory of FIG. 2 and provides a voltage level applying step 610, a write operating step 620 and a write voltage controlling step 630. The voltage level applying step 610 is for applying a plurality of voltage levels to the reference voltage Vref, the word line WL and the switching signal SW, respectively. The write operating step 620 is for driving the memory cell 200 to perform in a set process or a reset process via the first three-terminal switching element 300, the second three-terminal switching element 400 and the soft-verify controlling unit 500 during a write operation. The write voltage controlling step 630 is for controlling the write voltage $V_{HV\text{-}write}$ to be increased in the ramping cycle and decreased in the soft-verify cycle via the soft-verify write voltage controlling module 520. Therefore, the operating method 600 of the present disclosure does not require any read cycle to perform a verify operation with a sense amplifier so as to reduce power consumption. Moreover, the operating method 600 of the present disclosure has a lower voltage swing at the bit line BL and the source line SL and does not require to change a polarity of the bit line BL and the source line SL under the write operation.

Figure 10:
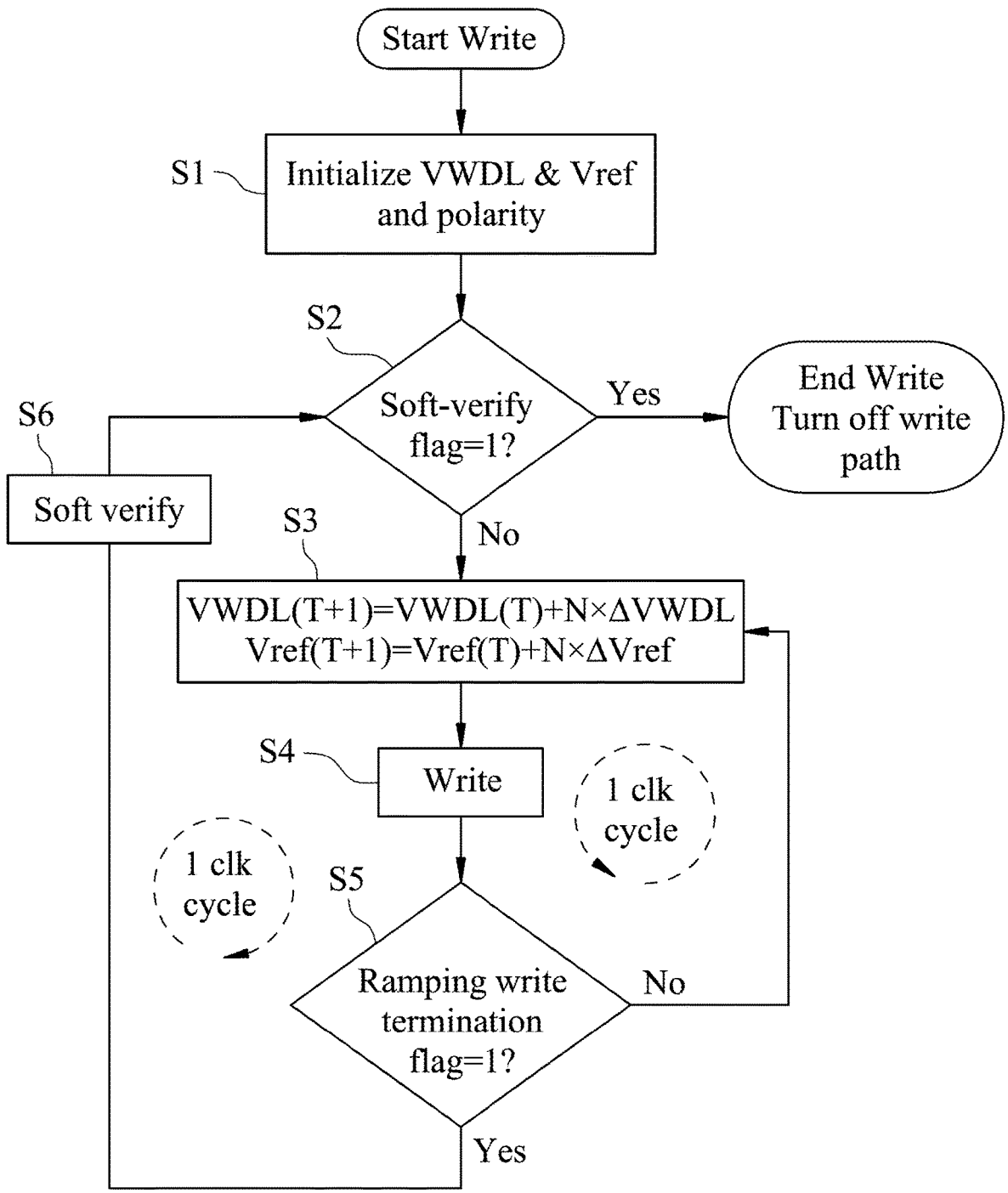
FIG. 10 shows a flow chart of an operating method of the soft-verify write assist circuit of the resistive memory according to another embodiment of the present disclosure.
Figure 11:
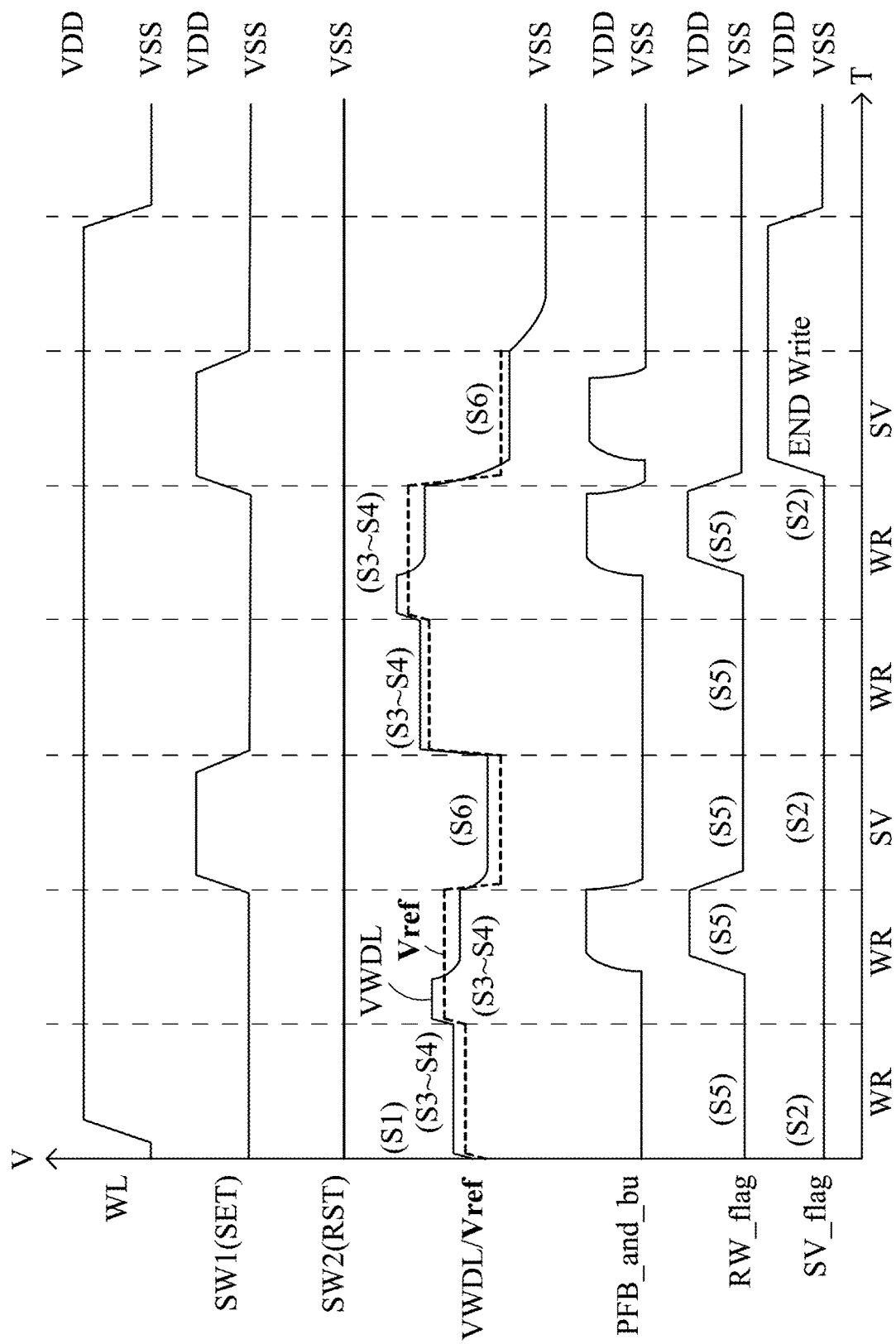
FIG. 11 shows timing diagrams of the operating method of the soft-verify write assist circuit of the resistive memory of FIG. 10.

FIG. 10 shows a flow chart of an operating method 600a of the soft-verify write assist circuit 100 of the resistive memory according to another embodiment of the present disclosure. FIG. 11 shows timing diagrams of the operating method 600a of the soft-verify write assist circuit 100 of the resistive memory of FIG. 10. The operating method 600a may be applied to the soft-verify write assist circuit 100 of the resistive memory of FIG. 2 and provides a voltage level applying step S1, a first flag checking step S2, a voltage level ramping step S3, a write operating step S4, a second flag checking step S5 and a soft-verify operating step S6.

The voltage level applying step S1 is for applying a plurality of voltage levels to the write data line WDL, the reference voltage Vref, the word line WL, the switching signal SW, the first switching control signal SW1(SET) and the second switching control signal SW2(RST) of FIG. 2, respectively. Therefore, the voltage level applying step S1 can initialize the voltage level VWDL of the write data line WDL, the voltage level of the reference voltage Vref and a polarity of the bit line BL and the source line SL (i.e., a set process or a reset process).

The first flag checking step S2 is for checking whether or not the soft-verify flag SV_flag is equal to 1. If the soft-verify flag SV_flag is equal to 1, the soft-verify write assist circuit 100 of the resistive memory turns off a write operation and a write path as so to end the write operation. If the soft-verify flag SV_flag is equal to 0, the voltage level ramping step S3 is performed.

The voltage level ramping step S3 is for ramping the voltage level VWDL of the write data line WDL and the voltage level of the reference voltage Vref according to an increment voltage ΔVWDL of the write data line WDL and an increment voltage ΔVref of the reference voltage Vref, respectively. Therefore, the voltage level VWDL of the write data line WDL and the voltage level of the reference voltage Vref may be represented as "VWDL(T+1)=VWDL(T)+N×ΔVWDL" and "Vref(T+1)=Vref(T)+N×ΔVref", respectively, wherein T is a time period, and N is a positive integer. The increment voltage ΔVWDL may be equal to the increment voltage ΔVref. The voltage level of the increment voltage ΔVWDL is based on a manufacturing process of the resistive memory. In other words, the write voltage $V_{HV\text{-}write}$ is slightly increased in the ramping cycle WR via the soft-verify write voltage controlling module 520, and then the write voltage $V_{HV\text{-}write}$ is applied to the write data line WDL.

The write operating step S4 is for driving the memory cell 200 to perform in the set process or the reset process via the first three-terminal switching element 300, the second three-terminal switching element 400 and the soft-verify controlling unit 500 during the write operation.

The second flag checking step S5 is for checking whether or not the ramping write termination flag RW_flag is equal to 1. If the ramping write termination flag RW_flag is equal to 1, the soft-verify operating step S6 is performed. If the ramping write termination flag RW_flag is equal to 0, the voltage level ramping step S3 is performed.

The soft-verify operating step S6 is for controlling the write voltage $V_{HV\text{-}write}$ to be decreased in the soft-verify cycle SV via the soft-verify write voltage controlling module 520. The soft-verify operating step S6 is performed between the second flag checking step S5 and the first flag checking step S2. Accordingly, the operating method 600a of the soft-verify write assist circuit 100 of the resistive memory of the present disclosure can utilize the ramping write termination flag RW_flag and the soft-verify flag SV_flag to check what exactly resistance of the memory cell 200 is, and does not require any read cycle to perform a verify operation with a sense amplifier so as to reduce power consumption. In addition, the operating method 600a of the present disclosure has a lower voltage swing at the bit line BL and the source line SL and does not require to change a polarity of the bit line BL and the source line SL under the write operation.

According to the aforementioned embodiments and examples, the advantages of the present disclosure are described as follows.

1. The present disclosure utilizes the ramping write termination flag and the soft-verify flag to check what exactly resistance of the memory cell is, and does not require any read cycle to perform a verify operation with a sense amplifier so as to reduce power consumption.

2. The present disclosure has a lower voltage swing at the bit line and the source line and does not require to change a polarity of the bit line and the source line under the write operation.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A soft-verify write assist circuit of a resistive memory, which is controlled by a reference voltage, a word line and a switching signal, the soft-verify write assist circuit of the resistive memory comprising:
   a memory cell controlled by the word line and comprising a bit line and a source line;
   a first three-terminal switching element electrically connected between the memory cell and a ground voltage, wherein the first three-terminal switching element is controlled by the switching signal;
   a second three-terminal switching element electrically connected to the memory cell, wherein the second three-terminal switching element is controlled by the switching signal; and
   a soft-verify controlling unit electrically connected to the second three-terminal switching element, and comprising:
      a write data line signally connected to the second three-terminal switching element;
      a comparator signally connected to the write data line and the reference voltage, wherein the comparator is configured a voltage level of the write data line with the reference voltage to generate a write voltage controlling signal; and
      a soft-verify write voltage controlling module signally connected to the comparator, wherein the soft-verify write voltage controlling module generates a write voltage according to the write voltage controlling signal, the write voltage is applied on the write data line, the write voltage is increased in a ramping cycle and decreased in a soft-verify cycle, and the soft-verify cycle is next to the ramping cycle;
   wherein the first three-terminal switching element is switched by the switching signal to enable the ground voltage to be coupled to the source line or the bit line, and the second three-terminal switching element is switched by the switching signal to enable the write data line to be coupled to the bit line or the source line.

2. The soft-verify write assist circuit of the resistive memory of claim 1, wherein the memory cell is performed in a set process or a reset process during a write operation;
   in the set process, the first three-terminal switching element is switched by the switching signal to enable the ground voltage to be coupled to the source line, and the second three-terminal switching element is switched by the switching signal to enable the write data line to be coupled to the bit line;
   in the reset process, the first three-terminal switching element is switched by the switching signal to enable the ground voltage to be coupled to the bit line, and the second three-terminal switching element is switched by the switching signal to enable the write data line to be coupled to the source line.

3. The soft-verify write assist circuit of the resistive memory of claim 1, wherein the soft-verify write voltage controlling module comprises:
   a first two-terminal switching element electrically connected to the write voltage controlling signal, wherein the first two-terminal switching element is controlled by a first switching control signal; and
   a set-path two-terminal switching element electrically connected between the write voltage and the write data line, wherein the set-path two-terminal switching element is coupled to the first two-terminal switching element.

4. The soft-verify write assist circuit of the resistive memory of claim 3, wherein,
   when the first two-terminal switching element becomes a short circuit, the set-path two-terminal switching element is controlled by the write voltage controlling signal; and
   when the first two-terminal switching element becomes an open circuit, the set-path two-terminal switching element becomes the short circuit.

5. The soft-verify write assist circuit of the resistive memory of claim 1, wherein the soft-verify write voltage controlling module comprises:
   a second two-terminal switching element electrically connected to the write voltage controlling signal, wherein the second two-terminal switching element is controlled by a second switching control signal;
   an inverter electrically connected to the second two-terminal switching element; and
   a reset-path two-terminal switching element electrically connected between the write voltage and the write data line, wherein the reset-path two-terminal switching element is coupled to the inverter.

6. The soft-verify write assist circuit of the resistive memory of claim 5, wherein,
   when the second two-terminal switching element becomes a short circuit, the reset-path two-terminal switching element is controlled by the write voltage controlling signal; and
   when the second two-terminal switching element becomes an open circuit, the reset-path two-terminal switching element becomes the short circuit.

7. The soft-verify write assist circuit of the resistive memory of claim 1, wherein,
   if the voltage level of the write data line is greater than the reference voltage, the write voltage controlling signal generated by the comparator is equal to the ground voltage; and
   if the voltage level of the write data line is smaller than the reference voltage, the write voltage controlling signal generated by the comparator is equal to a power supply voltage.

8. The soft-verify write assist circuit of the resistive memory of claim 2, wherein the soft-verify write voltage controlling module comprises:
   a soft-verify control block electrically connected between the write voltage controlling signal and the write voltage, wherein the soft-verify control block generates a ramping write termination flag in the ramping cycle and a soft-verify flag in the soft-verify cycle according to the write voltage controlling signal to change the write voltage.

9. The soft-verify write assist circuit of the resistive memory of claim 8, wherein,
   in the set process, if the write voltage controlling signal is equal to a power supply voltage in the ramping cycle, the ramping write termination flag is set to the power supply voltage; and
   in the reset process, if the write voltage controlling signal is equal to the ground voltage in the ramping cycle, the ramping write termination flag is set to the power supply voltage.

10. The soft-verify write assist circuit of the resistive memory of claim 9, wherein,
    in the set process, if the write voltage controlling signal is equal to the power supply voltage in the soft-verify cycle, the soft-verify flag is set to the power supply voltage; and in the reset process, if the write voltage controlling signal is equal to the ground voltage in the ramping cycle, the soft-verify flag is set to the power supply voltage.

11. An operating method of the soft-verify write assist circuit of the resistive memory of claim 1, comprising:
providing a voltage level applying step, wherein the voltage level applying step is for applying a plurality of voltage levels to the reference voltage, the word line and the switching signal, respectively;
providing a write operating step, wherein the write operating step is for driving the memory cell to perform in a set process or a reset process via the first three-terminal switching element, the second three-terminal switching element and the soft-verify controlling unit during a write operation; and
providing a write voltage controlling step, wherein the write voltage controlling step is for controlling the write voltage to be increased in the ramping cycle and decreased in the soft-verify cycle via the soft-verify write voltage controlling module.

12. The operating method of claim 11, wherein,
in the set process, the first three-terminal switching element is switched by the switching signal to enable the ground voltage to be coupled to the source line, and the second three-terminal switching element is switched by the switching signal to enable the write data line to be coupled to the bit line; and
in the reset process, the first three-terminal switching element is switched by the switching signal to enable the ground voltage to be coupled to the bit line, and the second three-terminal switching element is switched by the switching signal to enable the write data line to be coupled to the source line.

13. The operating method of claim 11, wherein,
in the write voltage controlling step, the soft-verify write voltage controlling module comprises:
a first two-terminal switching element electrically connected to the write voltage controlling signal, wherein first two-terminal switching element is controlled by a first switching control signal; and
a set-path two-terminal switching element electrically connected between the write voltage and the write data line, wherein the set-path two-terminal switching element is coupled to the first two-terminal switching element.

14. The operating method of claim 13, wherein,
when the first two-terminal switching element becomes a short circuit, the set-path two-terminal switching element is controlled by the write voltage controlling signal; and
when the first two-terminal switching element becomes an open circuit, the set-path two-terminal switching element becomes the short circuit.

15. The operating method of claim 11, wherein,
in the write voltage controlling step, the soft-verify write voltage controlling module comprises:
a second two-terminal switching element electrically connected to the write voltage controlling signal, wherein second two-terminal switching element is controlled by a second switching control signal;
an inverter electrically connected to the second two-terminal switching element; and
a reset-path two-terminal switching element electrically connected between the write voltage and the write data line, wherein the reset-path two-terminal switching element is coupled to the inverter.

16. The operating method of claim 15, wherein,
when the second two-terminal switching element becomes a short circuit, the reset-path two-terminal switching element is controlled by the write voltage controlling signal; and
when the second two-terminal switching element becomes an open circuit, the reset-path two-terminal switching element becomes the short circuit.

17. The operating method of claim 11, wherein,
if the voltage level of the write data line is greater than the reference voltage, the write voltage controlling signal generated by the comparator is equal to the ground voltage; and
if the voltage level of the write data line is smaller than the reference voltage, the write voltage controlling signal generated by the comparator is equal to a power supply voltage.

18. The operating method of claim 11, wherein,
in the write voltage controlling step, the soft-verify write voltage controlling module comprises:
a soft-verify control block electrically connected between the write voltage controlling signal and the write voltage, wherein the soft-verify control block generates a ramping write termination flag in the ramping cycle and a soft-verify flag in the soft-verify cycle according to the write voltage controlling signal to change the write voltage.

19. The operating method of claim 18, wherein,
in the set process, if the write voltage controlling signal is equal to a power supply voltage in the ramping cycle, the ramping write termination flag is set to the power supply voltage; and
in the reset process, if the write voltage controlling signal is equal to the ground voltage in the ramping cycle, the ramping write termination flag is set to the power supply voltage.

20. The operating method of claim 19, wherein,
in the set process, if the write voltage controlling signal is equal to the power supply voltage in the soft-verify cycle, the soft-verify flag is set to the power supply voltage; and
in the reset process, if the write voltage controlling signal is equal to the ground voltage in the ramping cycle, the soft-verify flag is set to the power supply voltage.

* * * * *